United States Patent [19]

Kawanishi et al.

[11] Patent Number: 4,926,431
[45] Date of Patent: May 15, 1990

[54] SEMICONDUCTOR LASER DEVICE WHICH IS STABLE FOR A LONG PERIOD OF TIME

[75] Inventors: Hidenori Kawanishi, Higashiosaka; Hiroshi Hayashi, Kyoto; Taiji Morimoto; Shinji Kaneiwa, both of Nara; Masahiro Yamaguchi, Tokai, all of Japan

[73] Assignee: Sharp Kabushiki Kaisha, Osaka, Japan

[21] Appl. No.: 415,417

[22] Filed: Sep. 29, 1989

Related U.S. Application Data

[63] Continuation of Ser. No. 227,960, Aug. 3, 1988, abandoned.

[30] Foreign Application Priority Data

Aug. 4, 1987 [JP] Japan ................................ 62-195722
Dec. 28, 1987 [JP] Japan ................................ 62-335808
Dec. 29, 1987 [JP] Japan ................................ 62-333967

[51] Int. Cl.$^5$ .............................................. H01S 3/19
[52] U.S. Cl. ...................................... 372/45; 372/46; 372/48
[58] Field of Search ........................ 372/45, 46, 48, 44

[56] References Cited

U.S. PATENT DOCUMENTS 4,567,060  1/1986  Hayakawa et al. .................... 372/46

FOREIGN PATENT DOCUMENTS 0000790  1/1985  Japan ................................ 372/48

OTHER PUBLICATIONS

Patent Abstracts of Japan, 5(23), E-45, 695, 12, Feb. 1981.
Patent Abstracts of Japan, 10(293), E-443, 2349, 4 Oct. 1986.
IEEE Journal of Quantum Electronics, QE-19(10), Oct. 1983, pp. 1530–1536.
Patent Abstracts of Japan 11(249), E-532, 2696, 13 Aug. 1987.
Patent Abstracts of Japan, 8(200), E-266, 1637, 13 Sep. 1984.
Patent Abstracts of Japan, 9(189), E-333, 1912, 6 Aug. 1985.

Primary Examiner—James W. Davie
Attorney, Agent, or Firm—Irell & Manella

[57] ABSTRACT

A semiconductor laser device comprises a substrate and a multi-layered crystal structure with an active layer for laser-oscillating operation, the multi-layered crystal structure being disposed on the substrate and having a striped channel area through which current is supplied to the active layer and a light-absorbing area positioned outside of the channeled area by which a difference between the amount of light to be absorbed inside of the channeled area and the amount of light to be absorbed outside of the channeled area is created, which causes a difference in the effective refractive index of the active layer, resulting in an optical waveguide in the active layer, wherein the active layer is flat and uniform and the width of the portion of the channel area in the vicinity of at least one facet is wider than that of the remaining portion of the channel area.

6 Claims, 8 Drawing Sheets

FIG. 5
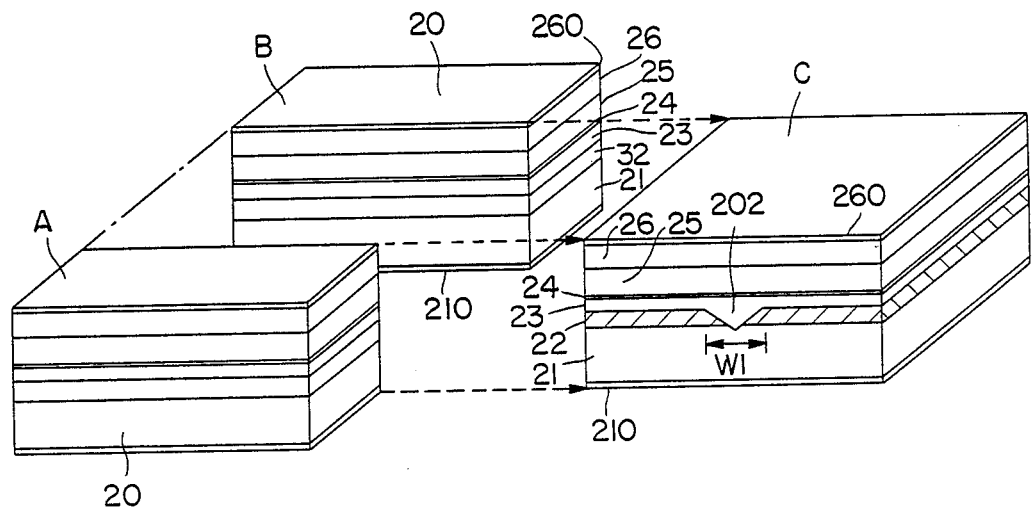
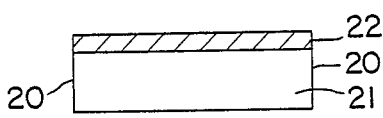
FIG. 6a
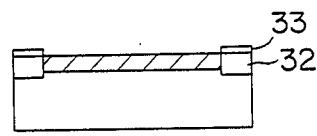
FIG. 6d
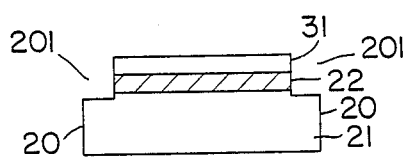
FIG. 6b
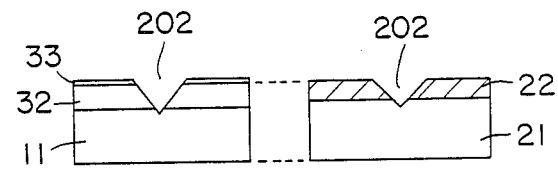
FIG. 6e
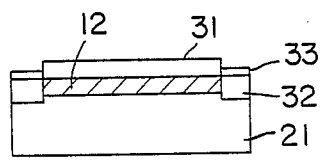
FIG. 6c AℓAs MOLE FRACTION

SEMICONDUCTOR LASER DEVICE WHICH IS STABLE FOR A LONG PERIOD OF TIME

This application is a continuation of application Ser. No. 27,960, filed Aug. 3, 1988 abandoned.

BACKGROUND OF THE INVENTION

1. Field of the Invention

This invention relates to a semiconductor laser device that is used as a light source in optical disc apparatuses, optical communication systems, etc. More particularly, it relates to a semiconductor laser device that can attain stabilized laser oscillation for a long period of time even at high output power.

2. Description of the Prior Art

Semiconductor laser devices that can oscillate coherent light have been used as light sources in optical disc apparatuses, optical communication systems, etc. As optical disc apparatuses, there have been add-on-memory type optical disc apparatuses that achieve writing operation and erasable memory type optical disc apparatuses that achieve erasing operation. Semiconductor laser devices that are used as light sources in these optical disc apparatuses are required to produce optical output power as high as 20–40 mW. For this purpose, in recent years, high output power semiconductor laser devices have been put into practice. The high output power semiconductor laser devices are disadvantageous in that the light-emitting facet thereof tends to deteriorate. It has been reported that high output power semiconductor laser devices oscillating laser light at high output power deteriorate in inverse proportion to the fourth power of the optical output in the cases where semiconductor laser devices with the same structure are examined.

FIG. 13 shows a conventional SAM (self aligned structure by molecular beam epitaxy)-type semiconductor laser device, which is produced as follows: On an n-GaAs substrate 71, an n-$Al_yGa_{1-y}$As cladding layer 72 with a thickness of 1.5 μm, an undoped $Al_xGa_{1-x}$As active layer 73 with a thickness of 0.08 μm, a p-$Al_yGa_{1-y}$As cladding layer 74 with a thickness of 0.15 μm, and an n-GaAs current blocking layer 75 with a thickness of 0.8 μm are successively formed by molecular beam epitaxy (wherein x<y). A portion of the current blocking layer 75 is removed into a stripe with a width of 5 μm in the resonating direction by an etching technique. Then, on both the remaining current blocking layer 75 and the exposed cladding layer 74, a p-$Al_yGa_{1-y}$As cladding layer 76 with a thickness of 1.5 μm and a p-GaAs contact layer 77 with a thickness of 0.5 μm are successively formed by molecular beam epitaxy. Then, an n-side electrode 78 and a p-side electrode 79 are formed on the bottom face of the substrate 71 and the top surface of the contact layer 77, respectively, resulting in a semiconductor laser device.

When current is injected into this semiconductor laser device, only a part of the current flows into and is confined within the portion of the active layer 73 corresponding to the striped area because of the current blocking layer 75. Laser light is produced in the said portion of the active layer 73. A part of the laser light that leaks from the said portion of the active layer 73 to the outside of the said portion thereof is absorbed by the current blocking layer 75, so that a difference in the effective refractive index of the active layer arises between the said portion of the active layer 73 corresponding to the striped area and the adjacent portion of the active layer 73 corresponding to the current blocking layer 75, resulting in an optical waveguide in the portion of the active layer 73 corresponding to the striped area. The laser light that is produced in the active layer 73 is confined within the said optical waveguide, and laser oscillation can be attained in a stabilized fundamental transverse mode.

This kind of semiconductor laser device attains laser oscillation in a stabilized fundamental transverse mode for a long period of time at low optical output power. However, it is disadvantageous in that when it oscillates laser light at high optical output power, it deteriorates remarkably so that the stabilized laser oscillation cannot be continued for a long period of time. The deterioration of the abovementioned semiconductor laser device arises from a phenomenon that the portions of the current blocking layer 75 in the vicinity of the facets absorb light that leaks from the active layer 75, generating heat. When the laser device oscillates laser light at high output power, the amount of light to be absorbed in the vicinity of the facets increases and the temperature thereof rises remarkably, resulting in a deterioration of the facets of the laser device, which makes it impossible to stably oscillate laser light for a long period of time.

FIG. 14 shows a conventional VSIS (V-channeled substrate inner stripe) semiconductor laser device, which is produced as follows: On a p-GaAs substrate 81, an n-GaAs current blocking layer 82 is formed. Then, a V-channel with a width W is formed on the current blocking layer 82 in such a manner that the V-channel reaches the substrate 81 through the current blocking layer 82. On the current blocking layer 82 including the V-channel, a p-GaAlAs cladding layer 83, a GaAs or GaAlAs active layer 84, an n-GaAlAs cladding layer 85, and an n-GaAs cap layer 86 are successively formed. Current for laser oscillation is confined by the n-GaAs current blocking layer 82 and flows into only the channel. Laser light that is produced in the active layer 84 is absorbed by the n-GaAs current blocking layer 82 that is positioned outside of the V-channel, so that a difference arises in the effective refractive index between the portion of the active layer 84 corresponding to the V-channel and the other portions of the active layer 84 corresponding to the outside of the V-channel, resulting in an optical waveguide in the active layer 84. Thus, laser oscillation can be attained in a stabilized fundamental transverse mode. This VSIS laser device is disadvantageous in that although it can attain laser oscillation in a stabilized fundamental transverse mode at a low output power level, it cannot continue to oscillate laser light for a long period of time at a high output power level with extreme reliability. The reasons why the above-mentioned laser device deteriorates at a high output power level are based on the deterioration of the shoulders of the V-channel in the vicinity of the facets, which is caused by heat generation of the n-GaAs current blocking layer 82 corresponding to the shoulder portions of the V-channel that absorbs light that leaks from the optical waveguide.

SUMMARY OF THE INVENTION

The semiconductor laser device of this invention, which overcomes the above-discussed and numerous other disadvantages and deficiencies of the prior art, comprises a substrate and a multi-layered crystal structure with an active layer for laser-oscillating operation, said multi-layered crystal structure being disposed on said substrate and having a striped channel area through which current is supplied to said active layer and a light-absorbing area positioned outside of said channeled area by which a difference between the amount of light to be absorbed inside of said channeled area and the amount of light to be absorbed outside of said channeled area is created, which causes a difference in the effective refractive index of said active layer, resulting in an optical waveguide in said active layer, wherein said active layer is flat and uniform and the width of the portion of said channel area in the vicinity of at least one facet is wider than that of the remaining portion of said channel area.

In a preferred embodiment, the semiconductor laser device includes an SAM semiconductor laser device, a VSIS semiconductor laser device, a CSP semiconductor laser device, an LOC semiconductor laser device, an SCH semiconductor laser device, and a GRIN-SCH-SQW semiconductor laser device.

In a preferred embodiment, the striped channel area is positioned over said active layer.

In a preferred embodiment, the striped channel area is positioned below said active layer.

In a preferred embodiment, the striped channel area is positioned in a manner to reach said substrate through said light-absorbing area.

In a preferred embodiment, the striped channel area is positioned on said substrate.

Thus, the invention described herein makes possible the objective of providing a semiconductor laser device in which the width of a striped channel area in the vicinity of the facets is wider than that of the striped channel area inside of the facets, so that the rise of the temperature of the facets that is caused by the light absorption can be prevented and the deterioration of the facets can be suppressed even at high output power operation, thereby attaining laser oscillation with extreme reliability even at a high output power level.

BRIEF DESCRIPTION OF THE DRAWINGS

This invention may be better understood and its numerous objects and advantages will become apparent to those skilled in the art by reference to the accompanying drawings as follows:

FIG. 5 is a perspective view showing the decomposition of another VSIS semiconductor laser device of this invention.

FIGS. 6a to 6e are schematic diagrams showing a production process of the semiconductor laser device shown in FIG. 5.

DESCRIPTION OF THE PREFERRED EMBODIMENTS

EXAMPLE 1

Figure 1:
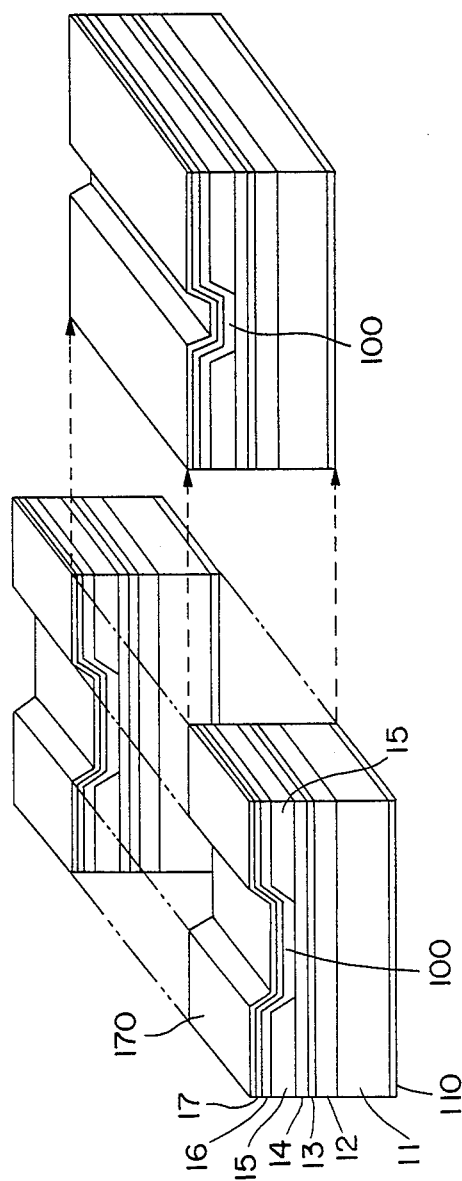
FIG. 1 is a perspective view showing the decomposition of an SAM-type semiconductor laser device of this invention.

FIG. 1 shows an SAM (self aligned structure by molecular beam epitaxy)-type semiconductor laser device of this invention, which comprises an active layer 13 with an optical waveguide. The width of the optical waveguide in the vicinity of the facets is wider than that of the optical waveguide inside of the facets.

This semiconductor laser device is produced as follows: On an n-GaAs substrate 11, an $nAl_{0.60}Ga_{0.40}As$ cladding layer 12 with a thickness of 1.5 $\mu$m, an undoped $Al_{0.15}Ga_{0.85}As$ active layer 13 with a thickness of 0.08 $\mu$m, a $p-Al_{0.60}Ga_{0.40}As$ cladding layer 14 with a thickness of 0.15 $\mu$m, and an n-GaAs current blocking layer 15 (that constitutes a light-absorbing area) with a thickness of 0.8 $\mu$m are successively formed by molecular beam epitaxy. Then, a portion of the current blocking layer 15 is removed in the resonating direction into a striped shape having widths of about 10 $\mu$m and about 5 $\mu$m over a given length in an alternate fashion, resulting in a striped channel area 100 in the current blocking layer 15. Then, on both the remaining current blocking layer 15 and the exposed cladding layer 14, a $p-Al_{0.60}Ga_{0.40}As$ cladding layer 16 with a thickness of 1.5 $\mu$m and a p-GaAs contact layer 17 with a thickness of 0.5 $\mu$m are successively formed by molecular beam epitaxy. Then, a p-side electrode 170 and an n-side electrode 110 are formed on the top surface of the contact layer 17 and the bottom face of the substrate 11, respectively, followed by cleaving the wafer at a wider portion of the striped channel area 100 of the said wafer, resulting in a semiconductor laser device with a cavity length of 250 $\mu$m. Thus, the said semiconductor laser device has a striped channel area that has wide portions with a width of about 10 $\mu$m each in the vicinity of the facets and a narrow portion of a width of about 5 $\mu$m inside the facets.

When current is injected into this semiconductor laser device, the current is confined within the portion of the active layer 13 corresponding to the said striped channel area 100 because of the current blocking layer 15. Since the current blocking layer 15 absorbs light that leaks from the portion of the active layer 13 corresponding to the said striped channel area 100, the effective refractive index of the portion of the active layer 13 corresponding to the outside of the said stripe (i.e., the current blocking layer 15) decreases, and accordingly a difference in the effective refractive index of the active layer 13 arises, resulting in an optical waveguide in the portion of the active layer corresponding to the said striped channel area 100. Light is propagated within the optical waveguide. Because the width of the striped channel area 100 in the vicinity of the facets is wider than that of the striped channel area 100 inside of the facets, the width of the optical waveguide in the vicinity of the facets is wider than that of the optical waveguide inside of the facets, as well, and light is diffused in the width direction in the wide striped portion of the optical waveguide resulting in a decrease in the amount of light that is to be absorbed by the current blocking layer 15 in the vicinity of the facets. Thus, the heat generation of the current blocking layer 15 in the vicinity of the facets is reduced. Moreover, the oscillation transverse mode of this semiconductor laser device is stabilized by the light that is confined within the narrow striped portion of the optical waveguide of the active layer 13, so that laser oscillation can be attained in a stabilized fundamental transverse mode even at a high output power level.

When the light-emitting facet of the abovementioned semiconductor laser device was coated with a substance with a reflectivity of 4% and the other facet thereof was coated with a substance with a reflectivity of 97%, the semiconductor laser device underwent no deterioration even at high output power (80 mW) operation.

EXAMPLE 2

Figure 2:
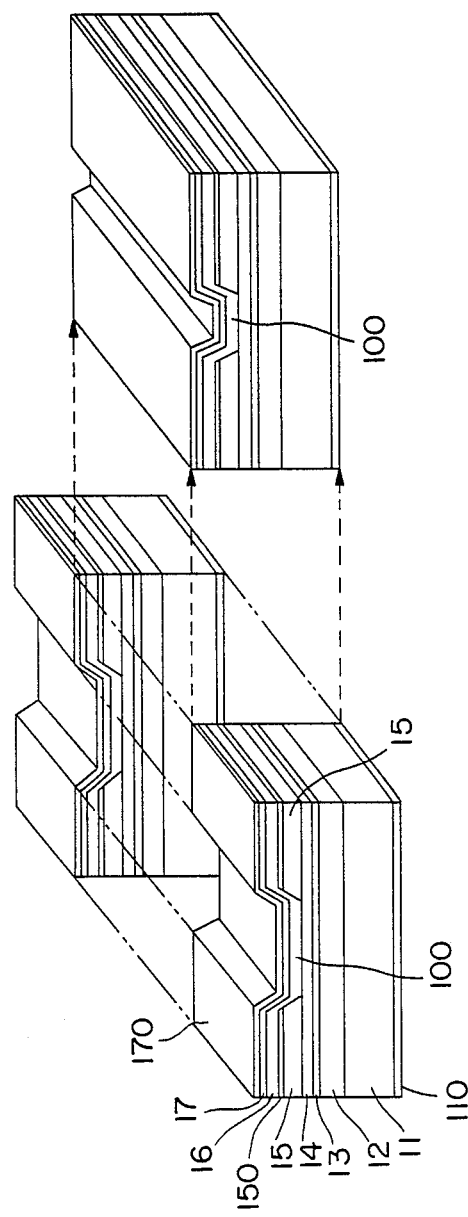
FIG. 2 is a perspective view showing the decomposition of another SAM-type semiconductor laser device of this invention.

FIG. 2 shows another SAM-type semiconductor laser device of this invention, which comprises an active layer 13 with an optical waveguide. The width of the optical waveguide in the vicinity of the facets is wider than that of the optical waveguide inside of the facets.

The semiconductor laser device is produced in the same way as that of Example 1, except for the following: After the n-GaAs current blocking layer 15 and an n-$Al_{0.15}Ga_{0.85}As$ protective layer 150 with a thickness of about 0.1 μm are formed on the p-$Al_{0.60}Ga_{0.40}As$ cladding layer 14, a striped channel is formed on the current blocking layer 15 by an etching technique in such a manner that the thickness of the bottom of the striped channel that is constituted by the current blocking layer 15 becomes 0.1–0.2 μm. In this way, because the cladding layer 14 is not exposed to the outside, the oxidation of the cladding layer 14 is prevented. Then, the bottom of the striped channel is removed by vacuum thermal etching within a growth furnace. Because the portion of the n-GaAs current blocking layer 15 outside of the striped channel is covered with the n-$Al_{0.15}Ga_{0.85}As$ protective layer 150, the said n-GaAs current blocking layer 15 is not etched. In this way, a semiconductor laser device is obtained.

When the light-emitting facet of this laser device was coated with a substance with a reflectivity of 4% and the other facet thereof was coated with a substance with a reflectivity of 97%, the laser device underwent no deterioration even at high output power (80 mW) operation.

Although the above-mentioned examples disclose semiconductor laser devices in which the width of the striped channel area in the vicinity of both facets is wider than that of the striped channel area inside of the facets, this invention is applicable to semiconductor laser devices in which the width of the striped channel area in the vicinity of the light-emitting facet alone is wider than that of the remaining portion of the striped channel area. When the length of the wide portion or portions of the striped channel area is set at 30 μm or less, laser oscillation can be attained in a stabilized transverse mode.

EXAMPLE 3

Figure 3:
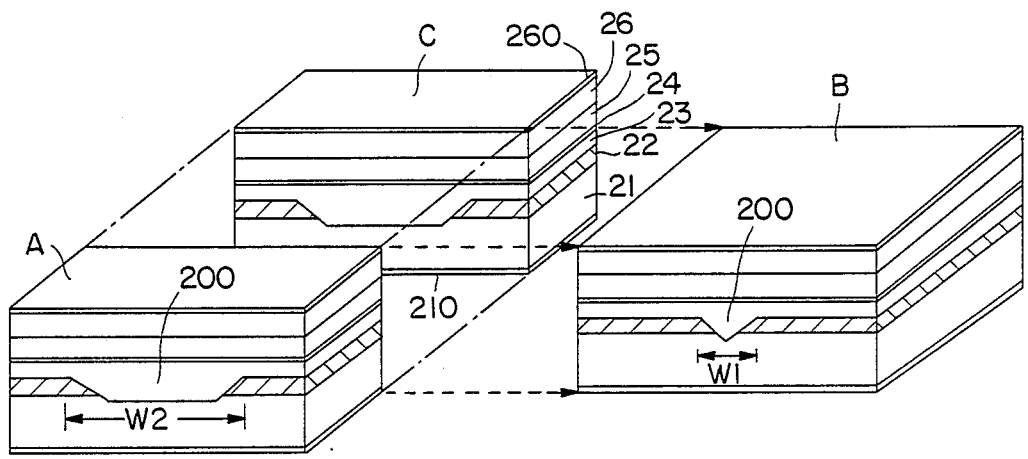
FIG. 3 is a perspective view showing the decomposition of a VSIS semiconductor laser device of this invention.

FIG. 3 shows a VSIS semiconductor laser device of this invention, which comprises an active layer 24 with an optical wavelength corresponding to a striped channel area that is formed into the same shape as that of Example 1.

Figure 4:
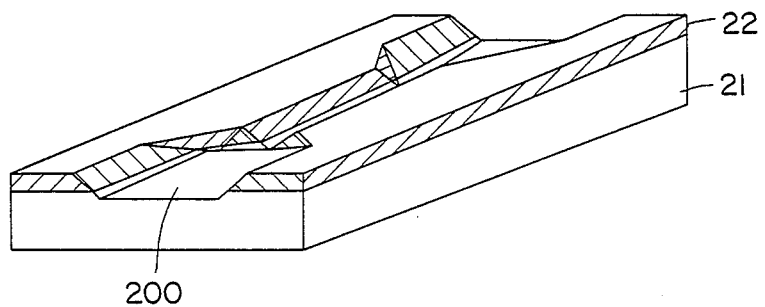
FIG. 4 is a perspective view showing the channeled substrate used in the semiconductor laser device shown in FIG. 3.

This semiconductor laser device is produced as follows: On a p-GaAs substrate 21, an n-GaAs current blocking layer 22 (that constitutes a light-absorbing area) with a thickness of about 0.7 μm is formed by liquid phase epitaxy. Then, as shown in FIG. 4, a striped channel 200 that has a width $W_2$ of 10 μm in the vicinity of the facets and a width $W_1$ of 4 μm inside of the facets and a depth of 1 μm is formed on the current blocking layer 22 by photolithography and an etching technique in such a manner that the channel 200 reaches the substrate 21 through the current blocking layer 22. The n-GaAs current blocking layer 22 can be also formed by vapor phase epitaxy. Then, on the current blocking layer 22 including the channel, a p-$Al_{0.42}Ga_{0.58}As$ cladding layer 23 with a thickness of 0.15 μm at the outside of the channel, a p- or n-$Al_{0.14}Ga_{0.86}As$ active layer 24 with a thickness of 0.08 μm, an n-$Al_{0.42}Ga_{0.58}As$ cladding layer 25 with a thickness of 0.8 μm. and an n-GaAs contact layer 26 with a thickness of 1.5 μm are successively formed by liquid phase epitaxy. Because the p-$Al_{0.42}Ga_{0.58}As$ cladding layer 23 is formed on the n-GaAs current blocking layer 22 including the channel in such a manner that the top surface thereof becomes flat, the $Al_{0.14}Ga_{0.86}As$ active layer 24 that is formed on the said flat cladding layer 23 becomes flat and uniform over the entire surface thereof.

Figure 11A:
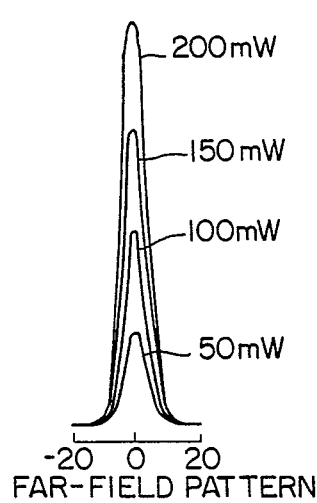
FIGS. 11a and 11b, respectively, are of graphs showing the far-field patterns attained by the semiconductor laser device of FIG. 3.
Figure 11B:
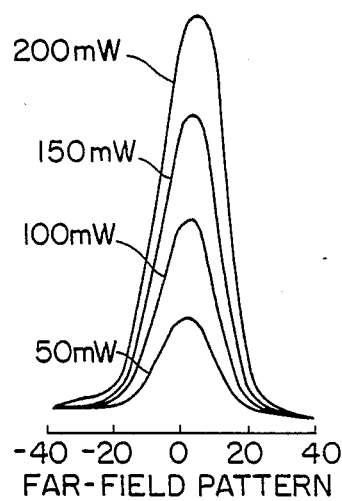
Figure 12:
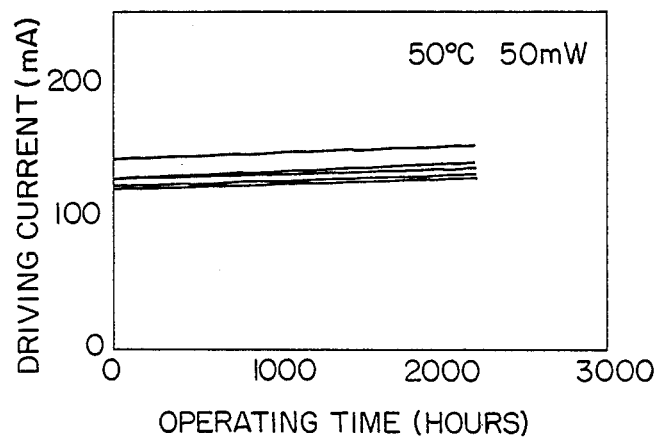
FIG. 12 is of graphs showing the results of the reliability tests on the semiconductor laser device of FIG. 3.
Figure 13:
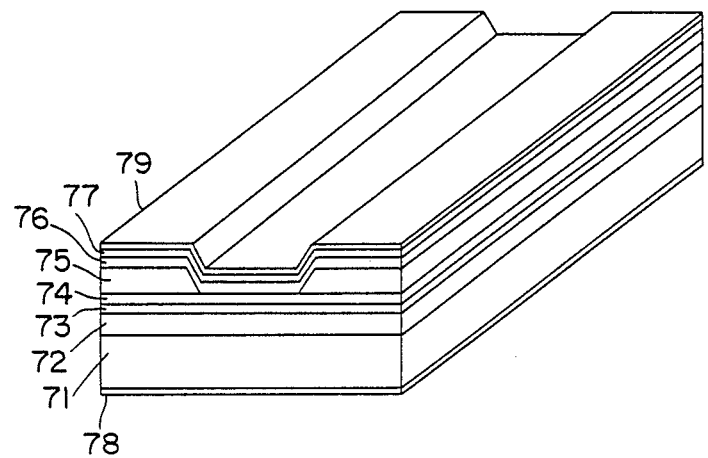
FIG. 13 is a perspective view showing a conventional SAM-type semiconductor laser device.
Figure 14:
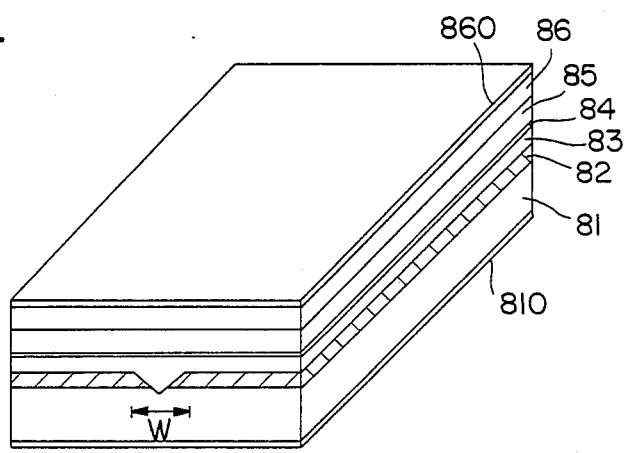
FIG. 14 is a perspective view showing a conventional VSIS semiconductor laser device.

Thereafter, a p-side electrode 210 and an inside electrode 260 are formed on the bottom face of the substrate 21 and the top surface of the contact layer 26, respectively. The resulting wafer is cleaved at a position at which it has a wider striped-channel area, resulting in a semiconductor laser device with a cavity length of 250 μm. The wider striped-channel area has a length of 10 μm from each facet to the inside of the facet. Because the amount of light to be absorbed by the portion of the n-GaAs current blocking layer 22 in the vicinity of each of the facets is reduced and heat generation of the said portion of the n-GaAs current blocking layer 22 is suppressed, this semiconductor laser device can attain laser oscillation with extreme reliability. When the light-emitting facet of the semiconductor laser device was coated with a substance with a reflectivity of 4% and the other facet thereof was coated with a substance with a reflectivity of 97%, the semiconductor laser device underwent no deterioration even at high output power (80 mW) operation. When the laser device operated at 40 mW optical output power, the temperature of the areas of the laser device in the vicinity of the facets was maintained at about 70° or less. The far-field patterns that are attained by this laser device in the directions vertical to and parallel to the active layer are shown in FIGS. 11a and 11b, indicating that the oscillation transverse mode of this laser device is stable even at an optical output power level of as high as 200 mW (CW). Moreover, FIG. 12 shows reliability tests on a plurality of semiconductor laser devices with the same structure as mentioned above at 50 mW output power operation at 50° C., indicating that these semiconductor laser devices run very stably over 2000 hours or more.

So long as the length of the wide portion or portions of the striped channel area is set at 30 μm or less, the mode of light that has been waveguided in the center region B of the resonator containing the narrow striped-channel area is not changed in the other regions A and C of the resonator containing the wide striped-channel area, so that this semiconductor laser device can attain a stabilized oscillation transverse mode. Even when the narrow portion of the striped channel area is formed in the vicinity of the light-emitting facet alone, the same effect as mentioned above can be, of course, attained.

EXAMPLE 4

FIG. 5 shows another VSIS semiconductor laser device of this invention, in which the optical waveguide is wider in the vicinity of facets and actually there is no waveguiding mechanism.

This semiconductor laser device is produced as follows: On a p-GaAs substrate 21, as shown in FIG. 6a, an n-GaAs current blocking layer 22 (that constitutes a light-absorbing area) with a thickness of about 0.7 μm is formed. Then, a SiO$_2$ film 31 with a thickness of 0.3 μm is formed on the current blocking layer 22 by the sputtering method, after which, as shown in FIG. 6b, grooves 201 that have a length of 10 μm from each of the facets 20 and a depth of 0.8 μm are formed using the SiO$_2$ film 31 as a mask. Then, as shown in FIG. 6c, a p-Al$_{0.42}$Ga$_{0.58}$As layer 32 with a thickness of 0.8 μm and an undoped GaAs layer 33 with a thickness of 0.05 μm that is etched back in the succeeding step are successively formed by metal-organic chemical vapor deposition, using the SiO$_2$ film 31 as a mask, in such a way that the top surface of the p-Al$_{0.42}$Ga$_{0.58}$As layer 32 is flush with the top surface of the current blocking layer 12. Then, the SiO$_2$ film 31 is removed by an etching technique as shown in FIG. 6d, after which a V-channel 202 with a width W$_1$ of 4 μm and a depth of 1 μm is formed on the current blocking layer 22 in such a way that the channel 202 reaches the substrate 21 through the current blocking layer 22. Thereafter, in the same way as that of conventional VSIS semiconductor laser devices, a p-Al$_{0.42}$Ga$_{0.58}$As cladding layer 23 with a thickness of 0.15 μm at the outside of the channel 202, a p- or n-Al$_{0.14}$Ga$_{0.86}$As active layer 24 with a thickness of 0.08 μm, an n-Al$_{0.42}$Ga$_{0.58}$As cladding layer 25 with a thickness of 0.8 μm, and an n-GaAs contact layer 26 with a thickness of 1.5 μm are successively formed on both the undoped GaAs layer 33 and the current blocking layer 22 including the channel 202 by liquid phase epitaxy. Because liquid phase epitaxy is used as a crystal growth technique, the top surface of the p-Al$_{0.42}$Ga$_{0.58}$As cladding layer 23 becomes flat, and accordingly the Al$_{0.14}$Ga$_{0.86}$As active layer 24 that is formed on the flat surface of the cladding layer 23 also becomes flat and uniform over the entire surface thereof. The undoped GaAs layer 33 functions to prevent the p-Al$_{0.42}$Ga$_{0.58}$As layer 32 from being oxidized. The said undoped layer 33 is etched back in the succeeding growth step, which results in the p-Al$_{0.42}$Ga$_{0.58}$As cladding layer 23 with a uniform thickness of 0.95 μm in the vicinity of each facet. Because the thickness 0.95 μm) of the portion of the Al$_{0.42}$Ga$_{0.58}$As cladding layer 23 in the vicinity of each facet is greater than that (0.15 μm) of the portion of the said Al$_{0.42}$Ga$_{0.58}$As cladding layer 23 outside of the channel 202 as mentioned above, light absorption does not occur in the portions A and B of the resonator including the facets 20.

Thereafter, on both surfaces of the resulting wafer, ohmic electrodes 210 and 260 are formed, followed by cleaving it at the position at which there is no n-GaAs current blocking layer 22, resulting in a semiconductor laser device.

The absorption of light does not take place in the portions A and B of the laser device in the vicinity of the facets 20, so that heat generation therein can be suppressed. When the light-emitting facet of this laser device was coated with a substance with a reflectivity of 4% and the other facet thereof was coated with a substance with a reflectivity of 97%, this laser device did not undergo deterioration even at 80 mW high output power operation.

Although this example disclose the laser device in which there is no n-GaAs current blocking layer 22 over the areas with a length of 10 μm each from the facets, so long as the length of the said areas is set to be 30 μm or less, the mode of light that has been waveguided in the center portion C of the resonator is not changed in the portions A and B of the resonator in the vicinity of the facets, resulting in a stabilized oscillation transverse mode. Even when the area that has no n-GaAs current blocking layer 22 is disposed in the vicinity of the light-emitting facet alone, the same effect as mentioned above can be attained.

EXAMPLE 5

Figure 7:
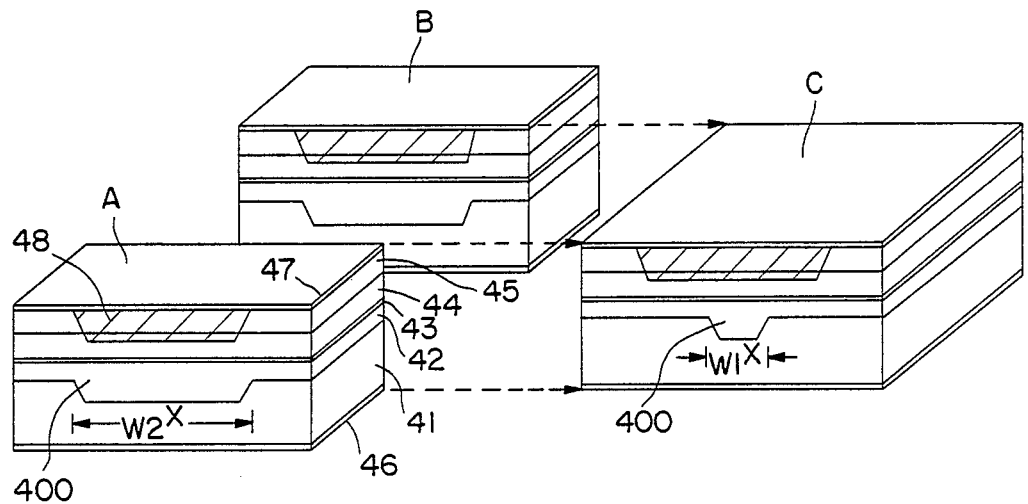
FIG. 7 is a perspective view showing the decomposition of a CSP semiconductor laser device of this invention.

This invention is also applicable to a CSP (transverse mode stabilized Al$_x$Ga$_{1-x}$As injection lasers with channeled-substrate-planar structure) semiconductor laser device that is disclosed in IEEE JOURNAL OF QUANTUM ELECTRONICS, vol. QE-14, No. 2, P. 89, February, 1978. FIG. 7 shows a CSP semiconductor laser device of this invention, which comprises a channeled substrate 41 that constitutes a light-absorbing area. The channel 400 of a striped shape has a width W$_1$ in the center portion C of the laser device and a width W$_2$ in the other portions A and B that are positioned in the vicinity of the facets (wherein W$_2$>W$_1$) After the channel 400 is formed, an n-Al$_x$Ga$_{1-x}$As cladding layer 42, a GaAs active layer 43, a p-Al$_x$Ga$_{1-x}$As cladding layer 44, and an n-GaAs contact layer 45 are successively formed on the channeled substrate 41, after which a Zn-diffusion region 48 is formed so that it reaches the cladding layer 44 through the contact layer 45 in the area corresponding to the channel 400, resulting in a current path. Although the absorption of light by the n-GaAs substrate 41 takes place in the outer portions A and B of the resonator resulting in heat generation therein, because the portion of the channel 400 in the vicinity of each facet is made wider than that of the channel 400 inside of the facets and the channel 400 is filled with the cladding layer 42, the said heat generation in the area in the vicinity of each facet is reduced, so that the semiconductor laser device can attain laser oscillation with extreme reliability. The channel 400 can be formed in the portion of the substrate 41 other than the area in the vicinity of one facet, by which the same effect as mentioned above can be attained.

Although the above-mentioned examples disclose semiconductor laser devices with a double-heterostructure, this invention is applicable to semiconductor laser device with other structures such as LOC (large optical cavity) semiconductor laser devices, SCH (separate confinement heterostructure) semiconductor laser devices, quantum well semiconductor laser devices, etc.

EXAMPLE 6

Figure 8:
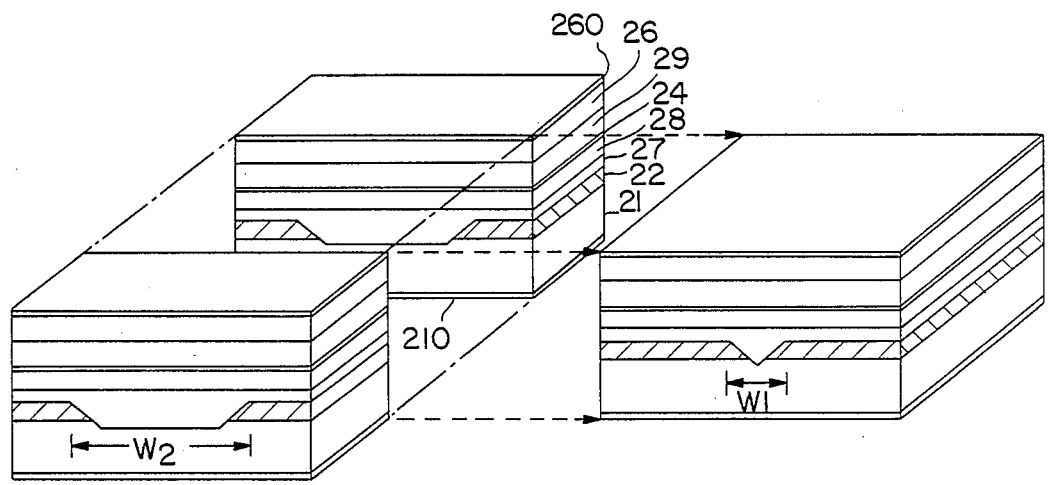
FIG. 8 is a perspective view showing the decomposition of an LOC semiconductor laser device of this invention.

FIG. 8 shows an LOC semiconductor laser device of this invention, which has the same structure as that of Example 3 shown in FIG. 3, except that an optical waveguiding layer 28 is disposed adjacent to the active layer 24. This semiconductor laser device has an n-GaAs current blocking layer 22 that constitutes a light-absorbing area, a p-$Al_{0.4}Ga_{0.6}As$ cladding layer 27, a p-$Al_{0.3}Ga_{0.7}As$ optical waveguiding layer 28, a p- or n-$Al_{0.14}Ga_{0.86}As$ active layer 24, an n-$Al_{0.7}Ga_{0.3}As$ cladding layer 29, and an n-GaAs contact layer 26, in that order, on a p-GaAs substrate 21. This semiconductor laser device can also attain the same effect as those of the above-mentioned examples.

EXAMPLE 7

Figure 9:
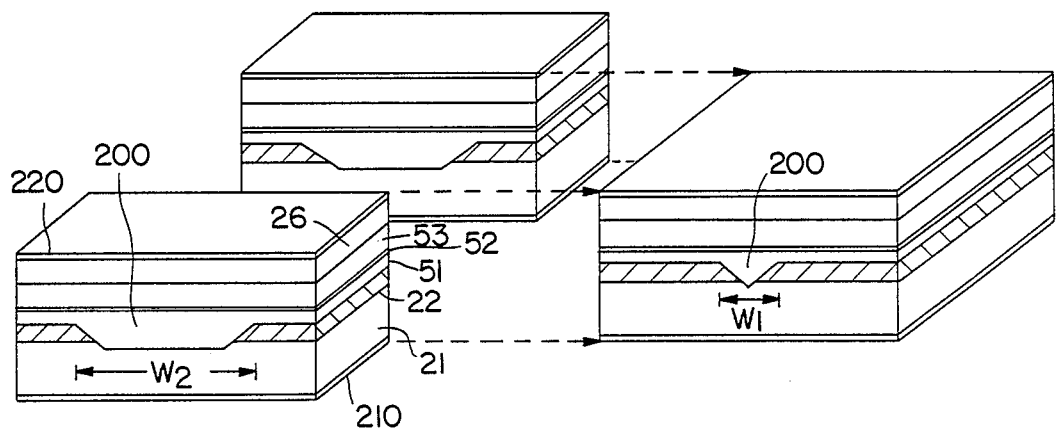
FIG. 9 is a perspective view showing the decomposition of a GRIN-SCH-SQW semiconductor laser device of this invention.
Figure 10:
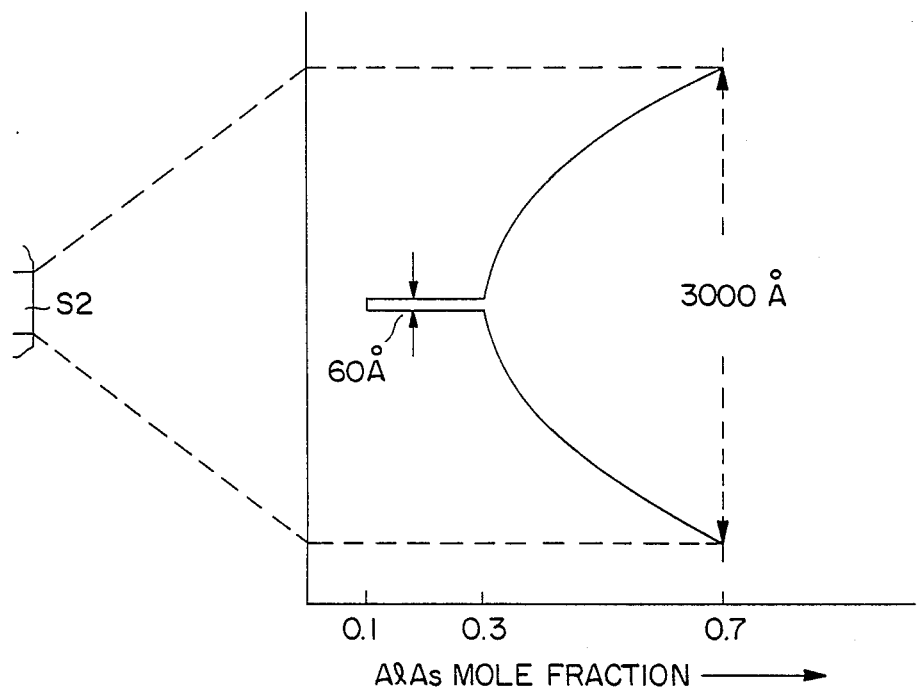
FIG. 10 is of a graph showing the distribution of the AlAs mole fraction of a mixed crystal that constitutes the active layer of the semiconductor laser device shown in FIG. 9.

FIG. 9 shows a GRIN-SCH-SQW (graded index-separate confinement heterostructure-single quantum well) semiconductor laser device of this invention, which comprises an n-GaAs current blocking layer 22 that constitutes a light-absorbing area, a p-$Al_{0.7}Ga_{0.3}As$ cladding layer 51, a GRIN-SCH-SQW $Al_xGa_{1-x}As$ active layer 52, an n-$Al_{0.7}Ga_{0.3}As$ cladding layer 53, and an n-GaAs contact layer 26, in that order, on a p-GaAs substrate 21. The striped channel 200 that is disposed in a manner to reach the substrate 21 through the current blocking layer 22 has a width $W_2$ in the vicinity of the facets and a width $W_1$ inside of the facets (wherein $W_1 < W_2$). FIG. 10 shows the AlAs mole fraction distribution of the $Al_xGa_{1-x}As$ active layer 52, indicating that the AlAs mole fraction (i.e., x) varies from 0.3 to 0.7 according to the parabolic distribution in the thickness direction. This semiconductor laser device also can attain the same effect as those of the above-mentioned examples.

This invention is applicable to semiconductor laser devices with a flat and uniform active layer in which a striped optical waveguide is formed in the active layer based on a difference in the effective refractive index of the active layer. ECO (embedded confinement layer on optical guide) semiconductor laser devices can be also included in the scope of this invention. The semiconductor materials are not limited to those of the above-mentioned examples. For the crystal growth method, there are molecular beam epitaxy, liquid phase epitaxy, metal-organic vapor deposition, or the like.

Although Examples 1-7 disclose semiconductor laser devices that produce light with a wavelength of 780 nm, this invention is applicable to semiconductor laser devices that produce light with a wavelength of 810 nm or 830 nm. In the semiconductor laser devices that produce light with a wavelength of 810 nm, the AlAs mole fraction X of the $Al_xGa_{1-x}As$ active layer is set to be 0.10 and the AlAs mole fraction Y of the $Al_yGa_{1-y}As$ cladding layer is set to be 0.38. The semiconductor laser devices producing light with a wavelength of 830 nm has an $Al_xGa_{1-x}As$ active layer with an AlAs mole fraction X of 0.08 and an $Al_yGa_{1-y}As$ cladding layer with an AlAs mole fraction Y of 0.33.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising a substrate and a multi-layered crystal structure with an active layer for laser oscillation, said multi-layered crystal structure being disposed on said substrate and having a striped channel area through which current is supplied to said active layer and a light-absorbing area positioned outside of said channeled area by which a difference between the amount of light to be absorbed inside of said channel area and the amount of light to be absorbed outside of said channel area is created, which causes a difference in the effective refractive index of said active layer, resulting in an optical waveguide in said active layer,
    wherein said active layer is flat and uniform and the width of the portion of said channel area in the vicinity of at least one facet is wider than that of the remaining portion of said channel area; and
    wherein the ratio of the length of said portion of said channel area in the vicinity of at least one facet to that of the remaining portion of said channel portion is between approximately 0.04 and 0.12.

2. A semiconductor laser device according to claim 1 which includes an SAM semiconductor laser device, a VSIS semiconductor laser device, a CSP semiconductor laser device, an LOC semiconductor laser device, an SCH semiconductor laser device, and a GRIN-SCH-SQW semiconductor laser device.

3. A semiconductor laser device according to claim 1, wherein said striped channel area is positioned over said active layer.

4. A semiconductor laser device according to claim 1, wherein said striped channel area is positioned below said active layer.

5. A semiconductor laser device according to claim 4, wherein said striped channel area is positioned in a manner to reach said substrate through said light-absorbing area.

6. A semiconductor laser device according to claim 4, wherein said striped channel area is positioned on said substrate.

* * * * *